United States Patent
Ahn et al.

(10) Patent No.: US 6,589,719 B1
(45) Date of Patent: Jul. 8, 2003

(54) PHOTORESIST STRIPPER COMPOSITIONS

(75) Inventors: Seung-Hyun Ahn, Suwon-Si (KR); Sang-Mun Chon, Yongin-Si (KR); Hoe-Sik Chung, Gyeonggi-Do (KR); Mi-Sook Jeon, Seoul (KR); Eun-Mi Bae, Yongin-Si (KR); Baik-Soon Choi, Anyang-Si (KR); Ok-Seok Jang, Gyeonggi-Do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/116,030

(22) Filed: Apr. 5, 2002

(30) Foreign Application Priority Data

Dec. 14, 2001 (KR) .......................................... 2001-79490
Mar. 13, 2002 (KR) .......................................... 2002-13631

(51) Int. Cl.[7] ................................................. G03C 7/42

(52) U.S. Cl. ........................ 430/331; 430/329; 510/176

(58) Field of Search ................................. 430/329, 331; 510/176

(56) References Cited

U.S. PATENT DOCUMENTS

| 5,413,729 | A | * | 5/1995 | Gaul ........................... 252/162 |
| 5,866,305 | A | * | 2/1999 | Chon et al. .................. 430/331 |
| 6,117,623 | A | * | 9/2000 | Koshiyama et al. ......... 430/331 |
| 6,159,646 | A | * | 12/2000 | Jeon et al. ................... 430/331 |
| 6,169,646 | B1 | | 1/2001 | Macken et al. |
| 6,183,942 | B1 | | 2/2001 | Kim et al. |
| 6,458,518 | B1 | * | 10/2002 | Moon et al. ................. 430/331 |

FOREIGN PATENT DOCUMENTS

| JP | 8-104895 | 4/1996 |
| KR | 2001-0036461 | 5/2001 |

* cited by examiner

*Primary Examiner*—Richard L. Schilling
(74) *Attorney, Agent, or Firm*—Volentine Francos, PLLC

(57) ABSTRACT

A photoresist stripper composition is made up of a mixture of an acetic acid ester, γ-butyrolactone (GBL), and a non-acetate ester or a poly alkyl alcohol derivative. The acetic acid ester may be at least one of n-butyl acetate, amyl acetate, ethyl aceto-acetate, and isopropyl acetate. The non-acetate ester may be at least one of ethyl lactate (EL), ethyl-3-ethoxy propionate (EEP) and methyl-3-methoxy (MMP). The poly alkyl alcohol derivative may be at least one of propylene glycol monomethyl ester (PGME) and propylene glycol monomethyl ester acetate (PGMEA).

22 Claims, 4 Drawing Sheets

| | PR 1 | PR 2 | PR 3 | PR 4 | PR 5 | PR 6 | PR 7 | PR 8 | PR 9 | PR 10 | PR 11 |
|---|---|---|---|---|---|---|---|---|---|---|---|
| Ex 1 | ○ | □ | □ | □ | □ | ○ | ○ | ○ | □ | ○ | ○ |
| Ex 2 | □ | □ | ○ | □ | ○ | ○ | ○ | ○ | ○ | ○ | ○ |
| Ex 3 | ○ | □ | □ | □ | □ | ○ | ○ | □ | □ | □ | □ |
| Ex 4 | □ | □ | □ | □ | □ | □ | ○ | □ | □ | □ | □ |
| Ex 5 | □ | □ | □ | □ | □ | □ | □ | □ | □ | □ | □ |
| Ex 6 | □ | □ | □ | □ | □ | □ | ○ | □ | □ | □ | □ |
| Ex 7 | □ | □ | □ | □ | □ | □ | □ | □ | □ | □ | □ |
| Ex 8 | ○ | ○ | □ | □ | ○ | ○ | ○ | ○ | ○ | ○ | ○ |
| Ex 9 | □ | ○ | □ | □ | □ | ○ | □ | ○ | □ | □ | ○ |
| Ex 10 | ○ | □ | ○ | ○ | ○ | ○ | ○ | ○ | ○ | □ | □ |
| Ex 11 | ○ | □ | □ | ○ | □ | ○ | ○ | □ | □ | □ | □ |
| Com. Ex 1 | □ | □ | □ | ○ | □ | ○ | ○ | □ | □ | ○ | □ |
| Com. Ex 2 | ○ | □ | □ | □ | □ | □ | □ | □ | ○ | X | ○ |
| Com. Ex 3 | ○ | ○ | ○ | □ | □ | ○ | □ | □ | ○ | □ | □ |
| Com. Ex 4 | □ | X | □ | □ | ○ | □ | □ | □ | □ | □ | □ |
| Com. Ex 5 | ○ | □ | □ | □ | □ | ○ | □ | □ | □ | □ | ○ |

FIG. 3

|  | PR 3 | PR 4 | PR 5 | PR 6 | PR 7 | PR 9 | PR 10 | PR 11 |
|---|---|---|---|---|---|---|---|---|
| Ex 11 | ○ | ○ | ○ | ○ | ○ | ○ | ○ | ○ |
| Com. Ex 1 | □ | ○ | ○ | ○ | □ | ○ | ○ | ○ |
| Com. Ex 2 | □ | □ | □ | □ | □ | □ | □ | □ |
| Com. Ex 3 | X | X | X | X | X | X | X | X |
| Com. Ex 5 | □ | □ | □ | □ | □ | X | X | X |

FIG. 4

PHOTORESIST STRIPPER COMPOSITIONS

BACKGROUND OF THE INVENTION

1. Field of the Invention

The present invention generally relates to photoresist stripper compositions used in the manufacture of semiconductor devices, and more particularly, the present invention relates to photoresist stripper compositions which are especially suitable for use in the edge bead removal (EBR) and rework processes of photolithography.

2. Description of the Related Art

Rework and edge bead removal (EBR) processes are common processes encountered during photolithography of semiconductor wafers or substrates.

The rework process is carried out when a photoresist that has been coated onto a wafer contains defects. In this case, the defective photoresist is completely removed from the wafer using a stripper composition, thereby allowing the wafer to be reused.

On the other hand, EBR results from certain characteristics of the photoresist coating process. That is, the photoresist is coated onto a wafer by dispensing the photoresist material onto a surface of the wafer while the wafer is rotating. As a result, the photoresist material tends to accumulate at the edge of the wafer, forming a so-called edge bead. Also, during the spraying process, photoresist material inevitably becomes coated onto the backside of the wafer. Accordingly, in the EBR process, a stripper composition is used to remove any unwanted photoresist from the edge and backside of the wafer.

During both the rework and EBR process, it is important that the photoresist not dissolve too slowly or incompletely in the stripper composition, otherwise residual contaminants (photoresist) may remain on the substrate after the stripping process. Any such contaminants can reduce device yield and adversely impact product reliability.

In the meantime, to accommodate for increased degrees of integration of semiconductor devices, new photoresist are being developed. For example, a photoresist having novolak resin as a main component has been developed for application with light of I-line or G-line wavelengths. Also, amplified type photoresists which respond to an excimer laser or deep ultraviolet (DUV) also have been employed.

It is therefore desirable that a stripper composition for stripping the photoresist exhibit good solubility with respect to the various types of photoresists now being utilized. However, the solubility of conventional photoresist stripper compositions is often insufficient, particularly when used to remove DUV photoresists.

Further, a primary drawback to present photoresist stripper compositions is that they are expensive. For example, one commonly used stripper composition includes ethyl lactate(EL), ethyl-3-ethoxy propionate(EEP) and gamma-butyro lactone(GBL) (U.S. Pat. No. 5,866,305). Unfortunately, however, the main component is EEP(75 wt %), which is quite expensive. Also, DUV photoresists in particular dissolve too slowly using this composition.

Accordingly, there is a demand for photoresist stripper compositions which exhibit favorable stripping characteristics in both the rework and EBR processes, and with respect to different types of photoresists, yet which can be manufactured at relatively low cost.

SUMMARY OF THE INVENTION

According to one aspect of the present invention, a photoresist stripper composition consist essentially of a mixture of an acetic acid ester, γ-butyrolactone (GBL), and a non-acetate ester. The acetic acid ester may be one or more of n-butyl acetate (NBA), amyl acetate, ethyl aceto-acetate, and isopropyl acetate, with NBA being preferable. The non-acetate ester may be one or more of ethyl lactate (EL), ethyl-3-ethoxy propionate (EEP) and methyl-3-methoxy (MMP).

The mixture may include 8–95 wt % of the acetic acid ester, 0.1–13 wt % of the GBL, and 3–80 wt % of the non-acetate type ester. More preferably, the mixture may include 50–90 wt % of the acetic acid ester, 0.1–7 wt % of the GBL, and 10–70 wt % of the non-acetate type ester.

In the case where the acidic acid ester is NBA and the non-acetate type ester is EL, the mixture may include 50–85 wt % of the NBA, 1–13 wt % of the GBL, and 10–40 wt % of the EL. More preferably, the mixture may include 55–85 wt % of the NBA, 1–7 wt % of the GBL, and 10–40 wt % of the EL.

In the case where the acidic acid ester is NBA and the non-acetate type ester is EEP, the mixture may include 20–90 wt % of the NBA, 0.1–13 wt % of the GBL, and 10–70 wt % of the EEP. Preferably, the mixture may include 30–89 wt % of the NBA, 0.1–7 wt % of the GBL, and 20–70 wt % of the EEP. More preferably, the mixture may include 30–89 wt % of the NBA, 0.5–5 wt % of the GBL, and 10–65 wt % of the EEP.

In the case where the acidic acid ester is NBA and the non-acetate type ester is MMP, the mixture may include 50–90 wt % of the NBA, 1–13 wt % of the GBL, and 5–40 wt % of the MMP. More preferably, the mixture may include 55–90 wt % of the NBA, 1–7 wt % of the GBL, and 5–40 wt % of the MMP.

According to another aspect of the present invention, a photoresist stripper composition consist essentially of a mixture of an acetic acid ester, γ-butyrolactone (GBL), and an alcohol derivative. The acetic acid ester may be one or more of n-butyl acetate (NBA), amyl acetate, ethyl aceto-acetate, and isopropyl acetate, with NBA being preferable. The alcohol derivative may be one or more of propylene glycol monomethyl ester (PGME) and propylene glycol monomethyl ester acetate (PGMEA).

The mixture may include 42–90 wt % of the acetic acid ester, 1–13 wt % of the GBL, and 5–45 wt % of the alcohol derivative. More preferably, the mixture may include 50–85 wt % of the acetic acid ester, 1–7 wt % of the GBL, and 10–40 wt % of the alcohol derivative.

In the case where the acetic acid ester is NBA and the poly alkyl alcohol derivative is PGME, the mixture may include 50–85 wt % of the NBA, 1–13 wt % of the GBL, and 5–40 wt % of the PGME. More preferably, the mixture may include 55–85 wt % of the NBA, 1–7 wt % of the GBL, and 10–30 wt % of the PGME.

In the case where the acetic acid.ester is NBA and the poly alkyl alcohol derivative is PGMEA, the mixture may include 50–85 wt % of the NBA, 1–13 wt % of the GBL, and 10–40 wt % of the PGMEA. More preferably, the mixture may include 55–85 wt % of the NBA, 1–7 wt % of the GBL, and 10–40 wt % of the PGMEA.

Further, other non-major components such as surfactants may be added to the afore-described stripper compositions of the present invention. In the case of surfactants, it is preferable that the surfactant constitute less than 1 wt % of the mixture.

BRIEF DESCRIPTION OF THE DRAWINGS

The above and other aspects and features of the present invention will be readily understood from the description that follows, with reference to the accompanying drawings, in which:

FIG. 3 is a table showing residue characteristics of various stripper compositions as applied to certain commercially available photoresists; and FIG. 4 is a table showing EBR characteristics of various stripper compositions as applied to certain commercially available photoresists.

DETAILED DESCRIPTION OF THE PREFERRED EMBODIMENTS

The photoresist stripper compositions of the present invention are especially suitable for use with respect to various types of photoresists during edge bead removal (EBR) and rework processes of photolithography.

Figure 1:
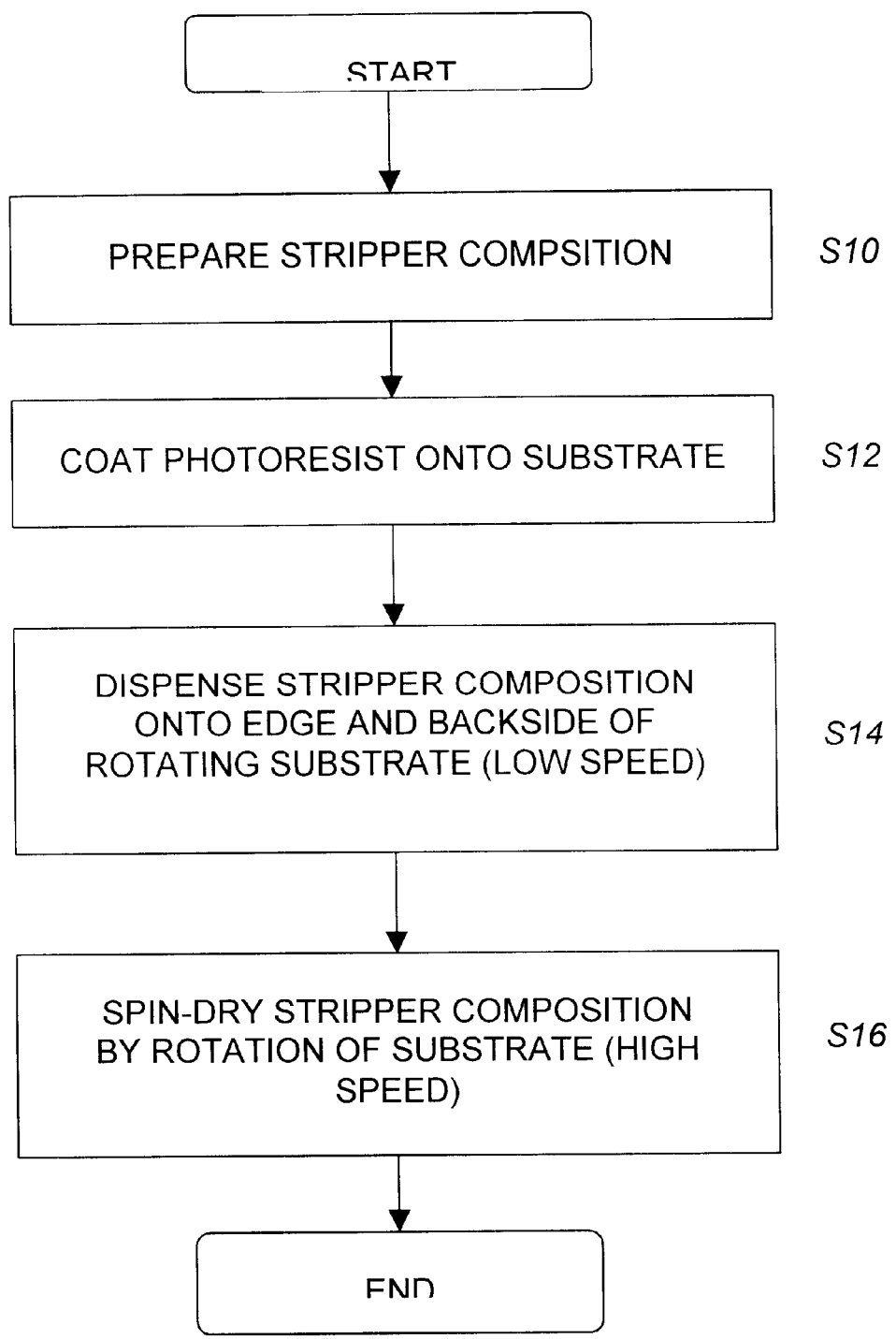
FIG. 1 is a flow chart for describing an edge bead removal (EBR) process used in photolithography.

FIG. 1 is a flow chart for describing a typical EBR process. In a step S10, a stripper composition of the invention is prepared, and in step S12, the photoresist is coated onto a substrate. Then, in step S14, the stripper composition is dispensed to an edge and back side of the wafer while the wafer is rotated at a relatively slow speed (e.g., 800–2000 rpm) for 5 to 10 seconds. The edge may be dispensed with stripper composition using one nozzle, and the back side may be dispensed using another nozzle. It is also possible to move a spray nozzle along the edge of a stationary wafer, as opposed to rotating the wafer. Lastly, at a step S16 (which may be omitted), a spin-dry process is carried out in which wafer is rotated at a relatively high speed (e.g., 2000–2500 rpm). The wafer may then be subjected to an exposure process and a developing process to form a photoresist pattern thereon.

Figure 2:
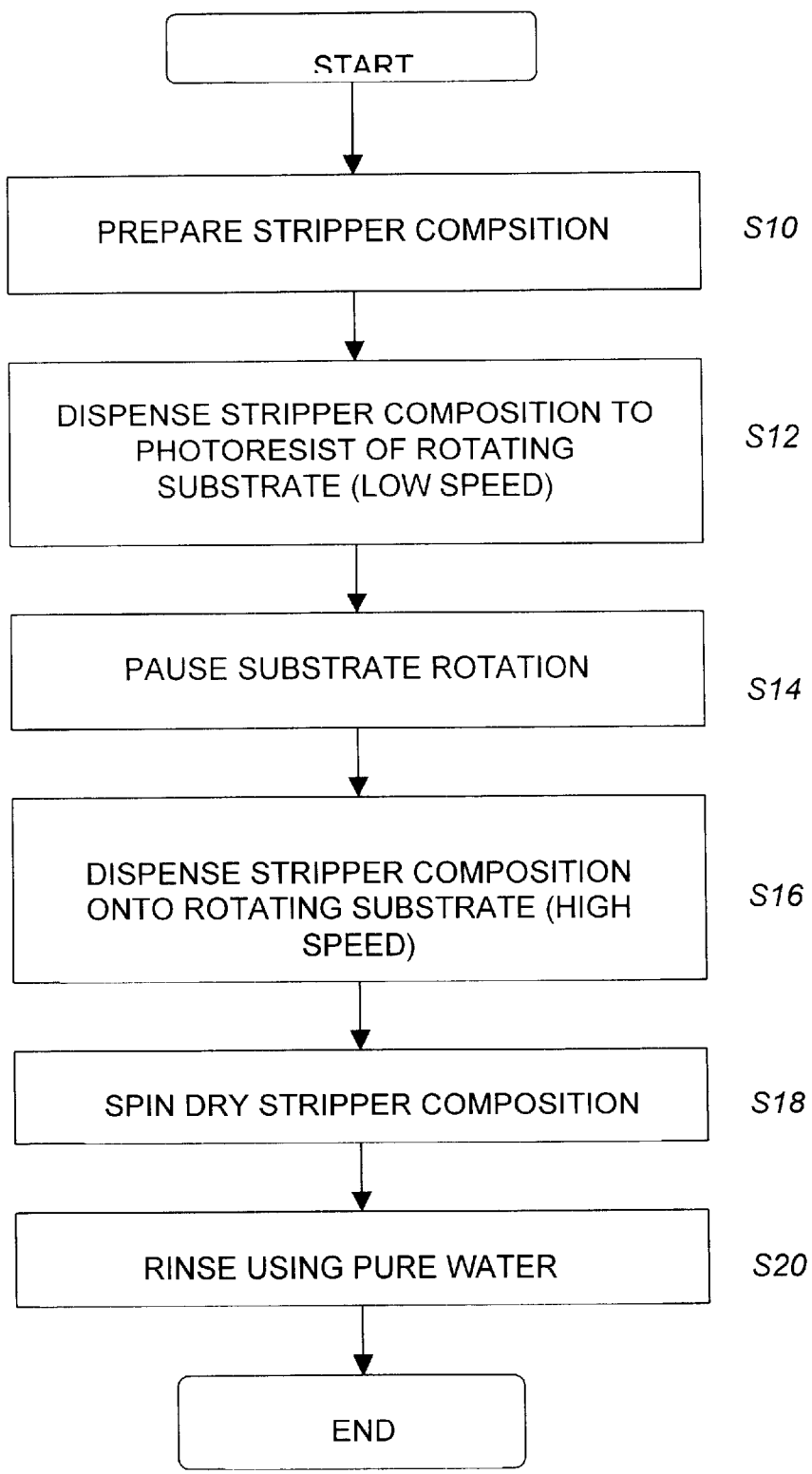
FIG. 2 is a flow chart for describing rework process used in photolithography.

FIG. 2 is a flow chart for describing the rework process. Here, in step S10, the stripper composition is prepared and, in step S12, is dispensed to the substrate which is rotated at a relatively low speed (e.g., 800–2000 rpm) for 10–20 seconds. Then, at step S14, the rotation of the substrate is temporarily paused for 10–30 seconds. Then, at step S16, the stripper composition is dispensed onto the substrate which is rotated this time at a relatively high speed (e.g., 2000–2500 rpm) for 10–20 seconds. Next, the wafer is spin-dried at step S18, and then rinsed using pure water at step S20. While FIG. 2 depicts a typical rework process, it should be noted that in some cases, an extra spin-dry is inserted between steps S14 and S16, and in other cases steps, S14, S16 and S20 are omitted.

A photoresist stripper composition according to a first embodiment of the present invention is a mixture in which an acetic acid ester, γ-butyrolactone (GBL), and a non-acetate ester are the major components thereof.

GBL is a relatively stable solvent and has a high burning point. In addition, GBL is used as a food additive and is environmentally safe. The physical characteristics of GBL are as follows: a specific gravity of 1.1254 at 25° C.; a viscosity of 1.7 cps at 25° C.; a boiling point at atmospheric pressure of 204° C.; a flash point at atmospheric pressure of 98.3° C.; and a burning point at atmospheric pressure of 457° C.

The acetic acid ester of the first embodiment may be, for example, n-butyl acetate (NBA), amyl acetate, ethyl aceto-acetate, or isopropyl acetate. These compounds can be used individually or in combination. However, NBA has particularly favorable characteristics since it exhibits good dissolubility with respect to photoresistive resins. The physical characteristics of NBA are as follows: a specific gravity of 0.882 at 20° C.; a viscosity of 0.693 cps at 25° C.; a boiling point at atmospheric pressure of 126.5° C.; a flash point at atmospheric pressure of 38° C.; and a burning point at atmospheric pressure of 421° C.

The non-acetate ester of the stripper composition of the first embodiment may be ethyl lactate (EL), ethyl-3-ethoxy propionate (EEP) or methyl-3-methoxy (MMP). These compounds can be used individually or in combination.

The mixture may include 8–95 wt % of the acetic acid ester, 0.1–13 wt % of the GBL, and 3–80 wt % of the non-acetate type ester. More preferably, the mixture may include 50–90 wt % of the acetic acid ester, 0.1–7 wt % of the GBL, and 10–70 wt % of the non-acetate type ester.

In the case where the acetic acid ester is NBA and the non-acetate type ester is EL, the mixture may include 50–85 wt % of the NBA, 1–13 wt % of the GBL, and 10–40 wt % of the EL. More preferably, the mixture may include 55–85 wt % of the NBA, 1–7 wt % of the GBL, and 10–40 wt % of the EL.

In the case where the acidic acid ester is NBA and the non-acetate type ester is EEP, the mixture may include 20–90 wt % of the NBA, 0.1–13 wt % of the GBL, and 10–70 wt % of the EEP. Preferably, the mixture may include 30–89 wt % of the NBA, 0.1–7 wt % of the GBL, and 20–70 wt % of the EEP. More preferably, the mixture may include 30–89 wt % of the NBA, 0.5–5 wt % of the GBL, and 10–65 wt % of the EEP.

In the case where the acidic acid ester is NBA and the non-acetate type ester is MMP, the mixture may include 50–90 wt % of the NBA, 1–13 wt % of the GBL, and 5–40 wt % of the MMP. More preferably, the mixture may include 55–90 wt % of the NBA, 1–7 wt % of the GBL, and 5–40 wt % of the MMP.

A photoresist stripper composition of the second embodiment of the present invention is a mixture in which an acetic acid ester, γ-butyrolactone (GBL), and an alcohol derivative are the major components thereof.

The previous description of GBL as it relates to the first embodiment of the invention applies to the second embodiment as well. Also, as with the first embodiment, the acetic acid ester may be one or more of n-butyl acetate (NBA), amyl acetate, ethyl aceto-acetate, and isopropyl acetate. These compounds can be used individually or in combination. However, as noted previously, NBA has particularly favorable characteristics.

The alcohol derivative may be a poly alkyl alcohol derivative, and may be propylene glycol monomethyl ester (PGME) or propylene glycol monomethyl ester acetate (PGMEA), and these compounds may also be used individually or in combination.

The mixture may include 42–90 wt % of the acetic acid ester, 1–13 wt % of the GBL, and 5–45 wt % of the alcohol derivative. More preferably, the mixture may include 50–85 wt % of the acetic acid ester, 1–7 wt % of the GBL, and 10–40 wt % of the poly alkyl alcohol derivative.

In the case where the acetic acid ester is NBA and the poly alkyl alcohol derivative is PGME, the mixture may include 50–85 wt % of the NBA, 1–13 wt % of the GBL, and 5–40 wt % of the PGME. More preferably, the mixture may include 55–85 wt % of the NBA, 1–7 wt % of the GBL, and 10–30 wt % of the PGME.

In the case where the acetic acid ester is NBA and the poly alkyl alcohol derivative is PGMEA, the mixture may include 50–85 wt % of the NBA, 1–13 wt % of the GBL, and 10–40 wt % of the PGMEA. More preferably, the mixture may include 55–85 wt % of the NBA, 1–7 wt % of the GBL, and 10–40 wt % of the PGMEA.

Further, other non-major components may be added to the aforedescribed stripper compositions of the first and second embodiments which do not materially affect the basic and novel characteristics of the invention. For example, while not substantially impacting the dissolvability per se of the stripper composition, a small amount of surfactant may be added to the mixture to improve wettability of the stripper toward the photoresist, and to thereby improve dispersion of the stripper composition. Suitable surfactants include alkyl benzene sulfonate and an alkaline metal salt thereof, alkylated diphenyl disulfonate and an alkaline metal salt thereof, alkyl aryl sulfonate, alkaline metal salt of fluoroalkyl carboxylate, and ammonium perfluoro alkyl sulfonate. It is preferable that any surfactant constitute less than 1 wt % of the mixture.

EXAMPLE AND COMPARATIVE EXAMPLES

A number (11) of non-limiting examples of the present invention are described below, followed by a number (5) of comparative examples.

Example 1

NBA, GBL and EL were placed into a vessel and mixed to prepare a stripper composition. The amount of each component of the stripper composition was adjusted to 85% by weight of NBA, 5% by weight of GBL, and 10% by weight of EL. The viscosity of the thus prepared stripper composition was 0.79 cp (measured in a thermostat at 25° C.).

Example 2

NBA, GBL and EL were placed in a vessel and mixed to prepare a stripper composition. The amount of each component of the stripper composition was adjusted to 75% by weight of NBA, 5% by weight of GBL and 20% by weight of EL. The viscosity of the thus prepared stripper composition was 0.88 cp (measured in a thermostat at 25° C.).

Example 3

NBA, GBL and EEP placed in a vessel and mixed to prepare a stripper composition. The amount of each component of the stripper composition was adjusted to 85% by weight of NBA, 5% by weight of GBL and 10% by weight of EEP. The viscosity of the thus prepared stripper composition was 0.74 cp (measured in a thermostat at 25° C.).

Example 4

NBA, GBL and EEP were place in a vessel and mixed to prepare a stripper composition. The amount of each component of the stripper composition was adjusted to 75% by weight of NBA, 5% by weight of GBL and 20% by weight of EEP. The viscosity of the thus prepared stripper composition was 0.74 cp (measured in a thermostat at 25° C.).

Example 5

NBA, GBL and EEP were placed in a vessel and mixed to prepare a stripper composition. The amount of each component of the stripper composition was adjusted to 35% by weight of NBA, 5% by weight of GBL and 60% by weight of EEP. The viscosity of the thus prepared stripper composition was 0.78 cp (measured in a thermostat at 25° C.).

Example 6

NBA, GBL and PGMEA were placed in a vessel and mixed to prepare a stripper composition. The amount of each component of the stripper composition was adjusted to 85% by weight of NBA, 5% by weight of GBL and 10% by weight of PGMEA. The viscosity of the thus prepared stripper composition was 0.74 cp (measured in a thermostat at 25° C.).

Example 7

NBA, GBL and PGMEA were placed in a vessel and mixed to prepare a stripper composition. The amount of each component of the stripper composition was adjusted to 75% by weight of NBA, 5% by weight of GBL and 20% by weight of EL. The viscosity of the thus prepared stripper composition was 0.74 cp (measured in a thermostat at 25° C.).

Example 8

NBA, GBL and PGME were placed in a vessel and mixed to prepare a stripper composition. The amount of each component of the stripper composition was adjusted to 85% by weight of NBA, 5% by weight of GBL and 10% by weight of PGME. The viscosity of the thus prepared stripper composition was 0.74 cp (measured in a thermostat at 25° C.).

Example 9

NBA, GBL and PGME were placed in a vessel and mixed to prepare a stripper composition. The amount of each component of the stripper composition was adjusted to 75% by weight of NBA, 5% by weight of GBL and 20% by weight of PGME. The viscosity of the thus prepared stripper composition was 0.78 cp (measured in a thermostat at 25° C.).

Example 10

NBA, GBL and MMP were placed in a vessel and mixed to prepare a stripper composition. The amount of each component of the stripper composition was adjusted to 90% by weight of NBA, 5% by weight of GBL and 5% by weight of MMP. The viscosity of the thus prepared stripper composition was 0.74 cp (measured in a thermostat at 25° C.).

Example 11

NBA, GBL and EEP were placed in a vessel and mixed to prepare a stripper composition. The amount of each component of the stripper composition was adjusted to 87% by weight of NBA, 1% by weight of GBL and 12% by weight of EEP. The viscosity of the thus prepared stripper composition was 0.74 cp (measured in a thermostat at 25° C.).

Comparative Example 1

EEP, EL and GBL were placed in a vessel and mixed to prepare a stripper composition. The amount of each component of the stripper composition was adjusted to 75% by weight of EEP, 20% by weight of EL and 5% by weight of GBL. The viscosity of thus the prepared stripper composition was 1.30 cp (measured in a thermostat at 25° C.).

Comparative Example 2

A stripper composition was prepared in accordance with a method disclosed in Korean Patent Laid-Open Publication No. 2001-0036461. NBA, GBL and acetone were placed in a vessel and mixed to prepare a stripper composition. The amount of each component of the stripper composition was adjusted to 85% by weight of NBA, 5% by weight of GBL and 10% by weight of acetone. The viscosity of thus the prepared stripper composition was 0.66 cp (measured in a thermostat at 25° C.).

Comparative Example 3

GBL and EL were placed in a vessel and mixed to prepare a stripper composition. The amount of each component of the stripper composition was adjusted to 20% by weight of GBL and 80% by weight of EL. The viscosity of the thus prepared stripper composition was 2.40 cp (measured in a thermostat at 25° C.).

Comparative Example 4

NBA and EL were placed in a vessel and mixed to prepare a stripper composition. The ratio of NBA to EL in the stripper composition was adjusted to 85:5 by weight. The viscosity of the thus prepared stripper composition was 0.74 cp (measured in a thermostat at 25° C.).

Comparative Example 5

NBA and GBL were placed in a vessel and mixed to prepare a stripper composition. The ratio of NBA to GBL in the stripper composition was adjusted to 85:5 by weight. The viscosity of the thus prepared stripper composition was 0.74 cp (measured in a thermostat at 25° C.).

Dissolving Rate Experiments

Example 8

Using the stripper composition prepared according to Example 8, experiments were carried out to measure the dissolving rate of the composition as applied to different commercially available photoresists.

Experiment 1 (PR1). 1.5 cc of I-line photoresist AZ1520HS (Clariant company, U.S.A.) was spin coated onto a substrate and then a soft baking (heating to 110° C.) was performed. The thickness of thus formed photoresist layer was 42,000 Å. Then, the substrate was dipped into the stripper composition at 25° C. to strip off the photoresist layer and the dissolving rate was observed. The observed dissolving rate was 5,000 Å/sec.

Experiment 2 (PR2). 1.5 cc of I-line photoresist MCPR-4100H (Shipley Korea company, Korea) was spin coated onto a substrate and then a soft baking (heating to 90° C.) was performed. The thickness of thus formed photoresist layer was 11,900 Å. Then, the substrate was dipped into the stripper composition at 25° C. to strip off the photoresist layer and the dissolving rate was observed. The observed dissolving rate was 3,000 Å/sec.

Experiment 3 (PR3). 1.5 cc of I-line photoresist SAT-701 (TOK company, Japan) was spin coated onto a substrate and then a soft baking (heating to 90° C.) was performed. The thickness of thus formed photoresist layer was 9,700 Å. Then, the substrate was dipped into the stripper composition at 25° C. to strip off the photoresist layer and the dissolving rate was observed. The observed dissolving rate was 9,700 Å/sec.

Experiment 4 (PR4). 1.5 cc of I-line photoresist SAT-668 (TOK company, Japan) was spin coated onto a substrate and then a soft baking (heating to 90° C.) was performed. The thickness of thus formed photoresist layer was 19,700 Å. Then, the substrate was dipped into the stripper composition at 25° C. to strip off the photoresist layer and the dissolving rate was observed. The observed dissolving rate was 19,000 Å/sec.

Experiment 5 (PR5). 1.5 cc of I-line photoresist MCPR-i7010N (Shipley Korea company, Korea) was spin coated onto a substrate and then a soft baking (heating to 110° C.) was performed. The thickness of thus formed photoresist layer was 35,000 Å. Then, the substrate was dipped into the stripper composition at 25° C. to strip off the photoresist layer and the dissolving rate was observed. The observed dissolving rate was 20,000 Å/sec.

Experiment 6 (PR6). 1.5 cc of I-line photoresist PFI-58A (Dongwoo company, Korea) was spin coated onto a substrate and then a soft baking (heating to 110° C.) was performed. The thickness of thus formed photoresist layer was 12,300 Å. Then, the substrate was dipped into the stripper composition at 25° C. to strip off the photoresist layer and the dissolving rate was observed. The observed dissolving rate was 12,200 Å/sec.

Experiment 7 (PR7). 1.5 cc of I-line photoresist THMR-ip3100 (TOK company, Japan) was spin coated onto a substrate and then a soft baking (heating to 110° C.) was performed. The thickness of thus formed photoresist layer was 14,400 Å. Then, the substrate was dipped into the stripper composition at 25° C. to strip off the photoresist layer and the dissolving rate was observed. The observed dissolving rate was 14,400 Å/sec.

Experiment 8 (PR8). 1.5 cc of g-line photoresist GS111M (Shipley Korea company, Korea) was spin coated onto a substrate and then a soft baking (heating to 90° C.) was performed. The thickness of thus formed photoresist layer was 12,200 Å. Then, the substrate was dipped into the stripper composition at 25° C. to strip off the photoresist layer and the dissolving rate was observed. The observed dissolving rate was 12,000 Å/sec.

Experiment 9 (PR9). 1.5 cc of far ultraviolet-line photoresist SEPR-402 (Shinetsu company, Japan) was spin coated onto a substrate and then a soft baking (heating to 100° C.) was performed. The thickness of thus formed photoresist layer was 10,300 Å. Then, the substrate was dipped into the stripper composition at 25° C. to strip off the photoresist layer and the dissolving rate was observed. The observed dissolving rate was 7,000 Å/sec.

Experiment 10 (PR10). 1.5 cc of deep ultraviolet ray photoresist SEPR-430 (Shinetsu company, Japan) was spin coated onto a substrate and then a soft baking (heating to 100° C.) was performed. The thickness of thus formed photoresist layer was 5,700 Å. Then, the substrate was dipped into the stripper composition at 25° C. to strip off the photoresist layer and the dissolving rate was observed. The observed dissolving rate was 5,700 Å/sec.

Experiment 11 (PR11). 1.5 cc of deep ultraviolet ray photoresist SSK-500MA (Sumitomo company, Japan) was spin coated onto a substrate and then a soft baking (heating to 100° C.) was performed. The thickness of thus formed photoresist layer was 16,000 Å. Then, the substrate was dipped into the stripper composition at 25° C. to strip off the photoresist layer and the dissolving rate was observed. The observed dissolving rate was 7,000 Å/sec.

As can been seen above, the stripper composition of Example 8 exhibits a good dissolving rate with respect to most photoresists. In addition, the stripper compositions prepared according to the other examples of the present invention exhibit similar results. As such, the stripper compositions of the present invention can be advantageously used to dissolve a variety of different photoresists coated on a substrate.

Residue Tests

Examples 1–11 and Comparative Examples 1–5

The stripper compositions prepared according to each of Examples 1–11 and Comparative Examples 1–5 were used to strip the commercially available photoresists discussed above in connection with each of Experiments 1–11, and the presence of photoresist residue was observed in each case. In particular, the same photoresists were coated onto substrates in the same manner as described in Experiments 1–11. The coated substrates were dipped into stripper compositions prepared according to Examples 1–11 and Comparative Examples 1–5 for 120 seconds, and then, the substrates were air-dried. The dried substrates were observed by means of a microscope to determine the presence of photoresist residue. Test results are shown in the table of FIG. 3.

In FIG. 3, "PR 1" denotes the photoresist prepared according the previously described Experiment 1, "PR 2" denotes the photoresist prepared according the previously described Experiment 2, and so on. Likewise, "Ex 1" denotes the stripper composition of Example 1, "Ex 2" denotes the stripper composition of Example 2, and so on. "Com. Ex 1" through "Com. Ex 5" denote the Comparative Examples 1–5.

Further, in FIG. 3, the symbol "o" denotes "good", which represents that no residue was present on the substrate.

The symbol "□" of FIG. 3 denotes "average", indicating that there was some residue present on the substrate.

Lastly, the symbol "X" of FIG. 3 denotes "poor", meaning that there was a considerable amount of residue present on the substrate.

As can be seen from FIG. 3, when the photoresist is stripped by dipping using the stripper compositions prepared from Examples 1–11, favorable stripping characteristics can be realized. Accordingly, the stripper compositions of the present invention are suitable for use in the stripping the photoresists through dipping processes.

EBR Tests

Example 11 and Comparative Examples 1–5

EBR characteristics were observed with respect to the stripper compositions of Example 11 and Comparative Examples 1–5. In particular, the stripper compositions of Example 11 and Comparative Examples 1–5 were dispensed onto the edge portion and backside of substrates having photoresists coated thereon. The photoresists used were those of aforementioned Experiments 3, 4, 5, 6, 7, 9, 10 and 11. Using a $N_2$ (nitrogen) pressure type coater, the compositions were dispensed with a $N_2$ pressure of 0.7 Kg/cm for 4 seconds. At the conclusion of the EBR process, the presence of photoresist residue and an edge profile state were observed by means of a microscope. The observation results are shown in FIG. 4.

In FIG. 4, "PR 3" denotes the photoresist prepared according the previously described Experiment 3, "PR 4" denotes the photoresist prepared according the previously described Experiment 4, and so on. Likewise, "Ex 11" denotes the stripper composition of Example 11, and "Com. Ex 1" through "Com. Ex 5" denote the stripper compositions of Comparative Examples 1–5.

Further, in FIG. 4, the symbol "o" denotes "good", which represents that no residue was present on the substrate and the edge profile was in a good state.

The symbol "□" of FIG. 4 denotes "average", indicating that there was no residue present on the substrate, but that the edge profile was in a poor state.

Lastly, the symbol "X" of FIG. 4 denotes "poor", meaning that there was residue present on the substrate and the edge profile was in a poor state.

The stripper composition of Example 11 exhibits favorable stripping characteristics in the EBR process, as shown in FIG. 4. Comparative Example 1 is quite expensive and exhibits a poor edge profile state when used to strip I-line photoresists. The acetone component of Comparative Example 2 gives rise to the poor edge profile state thereof, and the high viscosity (2.40 cp) of Comparative Example 3 results in very poor EBR characteristics. Finally, Comparative Example 5, which includes only NBA and GBL, also exhibits poor EBR characteristics.

The stripper compositions of the first and second embodiments include, as a major component, an acetic acid ester compound such as NBA. NBA in particular is advantageous in view of its low costs and favorable characteristics. However, the use of NBA alone is not acceptable, particularly since its relatively high wettability results in poor EBR process characteristics, i.e., poor edge profile states.

As such, GBL is added to the acetic acid ester compound to improve EBR process characteristics. This is because GBL exhibits good solubility and penetration characteristics. However, GBL is a relatively expensive compound, and excessive use thereof unacceptably increases costs. According to the present invention, an effective photoresist stripper composition is realized with only a limited amount of GBL.

Also, if the acetic acid ester compound and GBL are used alone, an unacceptable amount of photoresist residue is observed. According to the first embodiment, a non-acetate ester such as EL, EEP and/or MMP is added as a major component to reduce residue. According to the second embodiment, a poly alkyl alcohol derivative such as PGME and/or PGMEA is added as a major component to reduce residue.

The photoresist stripper compositions of the present invention exhibit favorable stripping characteristics as demonstrate herein, but can be manufactured at relatively low cost since only a limited amount GBL is used in combination with the acetic ester compound and the non-acetate ester or poly alkyl alcohol derivative.

Although the invention has been described with reference to the preferred embodiments, the preferred embodiments are for descriptive purposes only. As it will be apparent to one of ordinary skill in the art that modifications of the described embodiments may be made without departing from the spirit and scope of the invention, the scope of the appended claims is not to be interpreted as being restricted to these embodiments.

It is noted that a claim of priority has been made to Korean patent application Nos. 2001-79490 and 2002-13631, filed Dec. 14, 2001 and Mar. 13, 2002, respectively, the contents of both of which are incorporated herein by reference in their entirety.

What is claimed is:

1. A photoresist stripper composition consisting essentially of a mixture of n-butyl acetate(NBA), γ-butyrolactone (GBL), and a non-acetate type ester, wherein the non-acetate type ester is at least one of ethyl lactate (EL), ethyl-3-ethoxy propionate (EEP) and methyl-3-methoxy propionate (MMP), and wherein, based on a total weight of the mixture, the mixture includes 8–85 wt % of the NBA, 0.1–13 wt % of the GBL, and 3–80 wt % of the non-acetate type ester.

2. The photoresist stripper composition of claim 1, wherein, based on a total weight of the mixture, the mixture includes 50–90 wt % of the NBA, 0.1–7 wt % of the GBL, and 10–70 wt % of the non-acetate type ester.

3. The photoresist stripper composition of claim 1, wherein the non-acetate type ester is ethyl lactate (EL), and wherein, based on a total weight of the mixture, the mixture includes 50–85 wt % of the NBA, 1–13 wt % of the GBL, and 10–40 wt % of the EL.

4. The photoresist stripper composition of claim 1, wherein the non-acetate type ester is ethyl lactate (EL), and wherein, based on a total weight of the mixture, the mixture includes 55–85 wt % of the NBA, 1–7 wt % of the GBL, and 10–40 wt % of the EL.

5. The photoresist stripper composition of claim 1, wherein the non-acetate type ester is ethyl-3-ethoxy-propionate (EEP).

6. The photoresist stripper composition of claim 5, wherein, based on a total weight of the mixture, the mixture includes 20–90 wt % of the NBA, 0.1–13 wt % of the GBL, and 10–70 wt % of the EEP.

7. The photoresist stripper composition of claim 5, wherein, based on a total weight of the mixture, the mixture includes 30–89 wt % of the NBA, 0.1–7 wt % of the GBL, and 20–70 wt % of the EEP.

8. The photoresist stripper composition of claim 5, wherein, based on a total weight of the mixture, the mixture includes 30–89 wt % of the NBA, 0.5–5 wt % of the GBL, and 10–65 wt % of the EEP.

9. The photoresist stripper composition of claim 1, wherein the non-acetate type ester is methyl-3-methoxy propionate (MMP), and wherein, based on a total weight of the mixture, the mixture includes 50–90 wt % of the NBA, 1–13 wt % of the GBL, and 5–40 wt % of the MMP.

10. The photoresist stripper composition of claim 1, wherein the non-acetate type ester is methyl-3-methoxy propionate (MMP), and wherein, based on a total weight of the mixture, the mixture includes 55–90 wt % of the NBA, 1–7 wt % of the GBL, and 5–40 wt % of the MMP.

11. The stripper composition of claim 1, wherein the mixture contains a surfactant.

12. The stripper composition of claim 11, wherein, based on a total weight of the mixture, the mixture contains less than 1 wt % of the surfactant.

13. The stripper composition of claim 11, wherein the surfactant is one selected from the group consisting of alkyl benzene sulfonate, an alkaline metal salt of alkyl benzene sulfonate, alkylated diphenyl disulfonate, alkyl aryl sulfonate, an alkaline metal salt of fluoroalkyl carboxylate, ammonium perfluoro alkyl sulfonate, and mixtures thereof.

14. A photoresist stripper composition consisting essentially of a mixture of n-butyl acetate (NBA), γ-butyrolactone (GBL), and an alcohol derivative, wherein the alcohol derivative is at least one of propylene glycol monomethyl ether (PGME) and propylene glycol monomethyl ether acetate (PGMEA), and wherein, based on a total weight of the mixture, the mixture includes 42–90 wt % of the NBA, 1–13 wt % of the GBL, and 5–45 wt % of the alcohol derivative.

15. The photoresist stripper composition of claim 14, wherein, based on a total weight of the mixture, the mixture includes 50–85 wt % of the NBA, 1–7 wt % of the GBL, and 10–45 wt % of the alcohol derivative.

16. The stripper composition according to claim 14, wherein the alcohol derivative is propylene glycol monomethyl ether (PGME), and wherein, based on a total weight of the mixture, the mixture includes 50–85 wt % of the NBA, 1–13 wt % of the GBL, and 5–40 wt % of the PGME.

17. The stripper composition according to claim 14, wherein the alcohol derivative is propylene glycol monomethyl ether (PGME), and wherein, based on a total weight of the mixture, the mixture includes 55–85 wt % of the NBA, 1–7 wt % of the GBL, and 10–30 wt % of the PGME.

18. The stripper composition according to claim 14, wherein the alcohol derivative is propylene glycol monomethyl ether acetate (PGMEA), and wherein, based on a total weight of the mixture, the mixture includes 50–85 wt % of the NBA, 1–13 wt % of the GBL, and 10–40 wt % of the PGMEA.

19. The stripper composition according to claim 14, wherein the alcohol derivative is propylene glycol monomethyl ether acetate (PGMEA), and wherein, based on a total weight of the mixture, the mixture includes 55–85 wt % of the NBA, 1–7 wt % of the GBL, and 10–40 wt % of the PGMEA.

20. The stripper composition of claim 14, wherein the mixture contains a surfactant.

21. The stripper composition of claim 20, wherein, based on a total weight of the mixture, the mixture contains less than 1 wt % of the surfactant.

22. The stripper composition of claim 20, wherein the surfactant is one selected from the group consisting of alkyl benzene sulfonate, an alkaline metal salt of alkyl benzene sulfonate, alkylated diphenyl disulfonate, alkyl aryl sulfonate, an alkaline metal salt of fluoroalkyl carboxylate, ammonium perfluoro alkyl sulfonate, and mixtures thereof.

* * * * *